(12) United States Patent
Andros et al.

(10) Patent No.: US 6,219,238 B1
(45) Date of Patent: Apr. 17, 2001

(54) STRUCTURE FOR REMOVABLY ATTACHING A HEAT SINK TO SURFACE MOUNT PACKAGES

(75) Inventors: Frank E. Andros, Binghampton; Michael A. Gaynes, Vestal, both of NY (US); Hussain Shaukatullah, Tucson, AZ (US); Wayne R. Storr, New Milford, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/307,890

(22) Filed: May 10, 1999

(51) Int. Cl.[7] ....................................................... H05K 7/20
(52) U.S. Cl. ............................ 361/704; 24/625; 248/510; 257/719; 361/719
(58) Field of Search ......................... 174/16.3; 165/80.3, 165/185; 267/150, 158, 160; 24/457, 458, 625; 248/316.7, 505, 510; 361/703, 704, 707, 709, 712, 717–719, 720–722; 257/706, 707, 713, 718, 719, 727

(56) References Cited

U.S. PATENT DOCUMENTS

Re. 35,573    7/1997  Clemens .
4,404,617 *  9/1983  Ohyama .

(List continued on next page.)

FOREIGN PATENT DOCUMENTS

WO 95/09339   4/1995  (WO) .

OTHER PUBLICATIONS

Almquist, F.A., et al., "Spring–Clip Mounted Extruded Aluminum Heat Sink", *IBM Technical Disclosure Bulletin*, vol. 23, No. 12, May 1981, p. 5303.

Davies, Bill, et al., "CTAB–A New Package Solution To An Increasingly Frequent Problem", IEPS Conference, Sep. 1995, pp. 74–84.

Langston, Kent F., et al., "Heatsink Attach—The Agony And The Ecstasy—", NEPCON West '95, pp. 1543–1553.

Langston, Kent F., et al., "Heatsink Attach—The Agony And The Ecstacy II—", NEPCON West '96, pp. 1237–1265.

VEMALINE®, "Cool Your 486 Or Pentium™ Processor", Aug. 1993.

Lee, S.W., et al., "Low Profile Heat Sink", *IBM Technical Disclosure Bulletin*, vol. 28, No. 12, May 1986, pp. 5172–5173.

*Primary Examiner*—Gerald Tolin
(74) *Attorney, Agent, or Firm*—Connolly Bove Lodge & Hutz, LLP

(57) ABSTRACT

A structure for removably attaching a heat sink to an electronic package. At least one heat sink engaging member engages a surface of the heat sink opposite a surface of the heat sink engaging the electronic package. At least two heat sink retaining clips extend from opposite sides of the at least one heat sink engaging member. Each retaining clip includes a first arm for extending past a side of the heat sink and a portion of the electronic package and a second arm extending from the first member for engaging the electronic package.

15 Claims, 11 Drawing Sheets

U.S. PATENT DOCUMENTS

| | | |
|---|---|---|
| 4,552,206 | 11/1985 | Johnson et al. . |
| 4,587,595 | 5/1986 | Staples . |
| 4,660,123 | 4/1987 | Hermann . |
| 4,745,456 | 5/1988 | Clemens . |
| 4,878,108 | 10/1989 | Phelps, Jr. et al. . |
| 4,978,638 | 12/1990 | Buller et al. . |
| 5,198,693 | 3/1993 | Imken et al. . |
| 5,201,866 | 4/1993 | Mok . |
| 5,208,731 * | 5/1993 | Blomquist . |
| 5,276,585 | 1/1994 | Smithers . |
| 5,295,043 | 3/1994 | Beijer . |
| 5,304,735 | 4/1994 | Earl et al. . |
| 5,323,845 | 6/1994 | Kin-shon . |
| 5,329,426 | 7/1994 | Villani . |
| 5,331,507 | 7/1994 | Kyung et al. . |
| 5,353,193 | 10/1994 | Chia et al. . |
| 5,367,433 | 11/1994 | Blomquist . |
| 5,371,652 * | 12/1994 | Clemens . |
| 5,381,305 | 1/1995 | Harmon et al. . |
| 5,386,338 | 1/1995 | Jordan et al. . |
| 5,396,402 | 3/1995 | Perugini et al. . |
| 5,436,798 | 7/1995 | Wieland, Jr. . |
| 5,455,457 | 10/1995 | Kurokawa . |
| 5,461,257 | 10/1995 | Hundt . |
| 5,504,652 | 4/1996 | Foster et al. . |
| 5,559,674 | 9/1996 | Katsui . |
| 5,638,258 | 6/1997 | Lin . |
| 5,662,163 | 9/1997 | Mira . |
| 5,672,548 | 9/1997 | Culnane et al. . |
| 5,678,627 | 10/1997 | Lee . |
| 5,708,564 | 1/1998 | Lin . |
| 5,730,210 | 3/1998 | Kou . |
| 5,818,695 | 10/1998 | Olson . |
| 5,847,929 | 12/1998 | Bernier et al. . |
| 5,903,434 * | 5/1999 | Chiou . |
| 5,917,700 * | 6/1999 | Clemens . |
| 5,991,154 * | 11/1999 | Clemens . |

\* cited by examiner

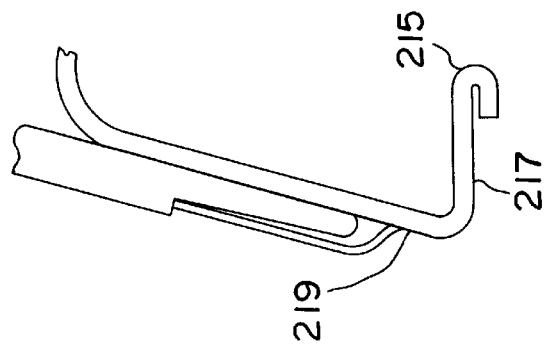
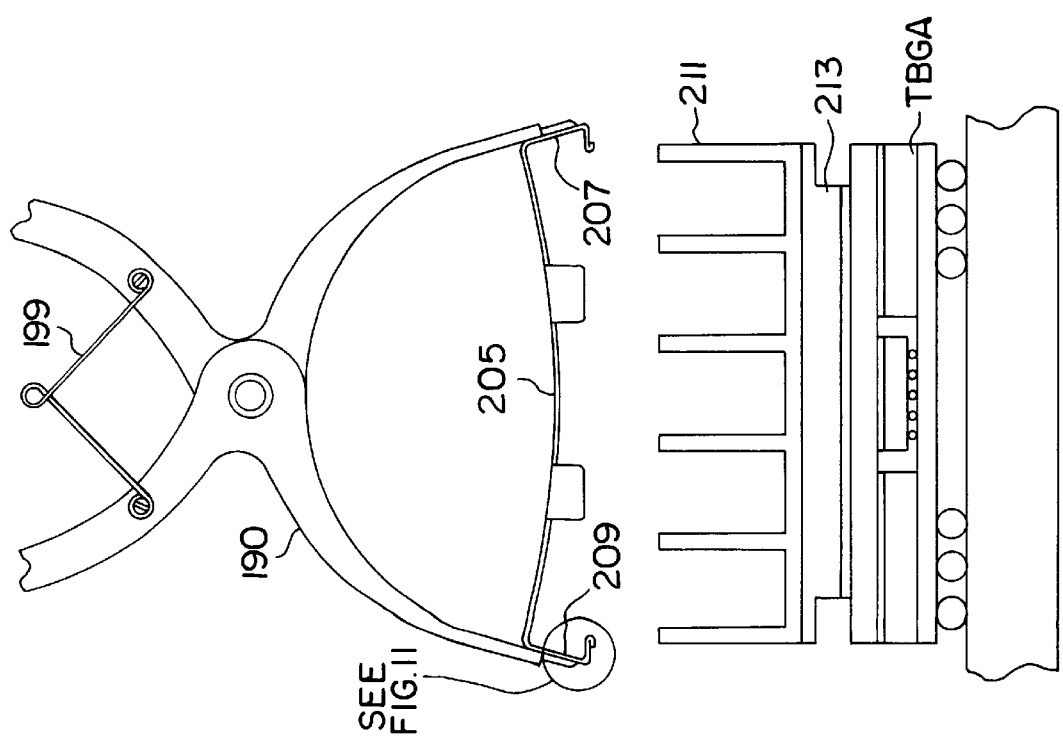

STRUCTURE FOR REMOVABLY ATTACHING A HEAT SINK TO SURFACE MOUNT PACKAGES

FIELD OF THE INVENTION

The invention relates to semiconductor device packaging. In particular, the present invention relates to a structure and method for removably attaching a heat sink to an electronic package, and particularly, a surface mount package.

BACKGROUND OF THE INVENTION

Typically, electronic devices, such as semiconductor chips are attached or mounted to various structures to facilitate their installation in a machine, such as a computer. For example, a chip may be mounted on a lead frame, chip support, or other such structure that may ultimately be interconnected with a circuit board or circuit card. A part of the packaging often includes a heat sink to dissipate heat generated by operation of the chip or other semiconductor device.

As chip density and speed of integrated circuit chips increases, chips often require high performance surface mount packages assembled very close to each other on circuit cards. These packages dissipate heat and, since they are packed very close to each other, they become hot. One of the most commonly used methods of cooling package is to attach heat sinks to the packages.

SUMMARY OF THE INVENTION

The present invention provides a structure for removably attaching a heat sink to an electronic package. The structure includes at least one heat sink engaging member for engaging a surface of the heat sink opposite a surface of the heat sink that engages the electronic package. At least two heat sink retaining clips extend from opposite sides of the at least one heat sink engaging member. Each retaining clip includes a first arm for extending past at least a portion of a side of the heat sink and at least a portion of the electronic package and a second arm extending from the first member for engaging the electronic package.

The present invention also provides an electronic package. The electronic package includes a semiconductor chip, a heat spreader plate that the chip is attached to, and a heat sink. The electronic package also includes an attachment structure for removably attaching the heat sink to the spreader plate. The attachment structure includes at least one heat sink engaging member for engaging the surface of the heat sink opposite a surface of the heat sink that engages the heat spreader plate. At least two heat sink retaining clips extend from opposite sides of the at least one heat sink engaging member. Each retaining clip includes a first arm for extending past at least a portion of a side of the heat sink and at least a portion of a side of the heat spreader plate and a second arm extending from the first arm for engaging the heat spreader plate.

The present invention also provides a method of removably attaching a heat sink to an electronic package. The method includes arranging a heat sink on a surface of an electronic package. An attachment structure is provided for removably attaching a heat sink to the heat spreader plate. The attachment structure includes at least one heat sink engaging member for engaging a surface of the heat sink opposite a surface of the heat sink that engages the heat spreader plate. At least two heat sink retaining clips extend from opposite sides of the at least one heat sink engaging member. Each retaining clip includes a first arm for extending past at least a portion of a side of the heat sink and at least a portion of a side of the heat spreader plate and a second arm extending from the first arm for engaging the electronic package. The attachment structure of the present invention is arranged over the heat sink and the electronic package is engaged with the second arm of the attachment structure.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 10 represents a cross-sectional view of the embodiment of the tool illustrated in FIG. 9 engaging an embodiment of a structure for removably attaching a heat sink to an electronic according to the present invention in the process of removing or installing the heat sink from an electronic package;

FIG. 11 represents a close-up cross-sectional view of a portion of the embodiment of the structure for removably attaching a heat sink illustrated in FIG. 10.

DETAILED DESCRIPTION OF THE INVENTION

Figure 1:
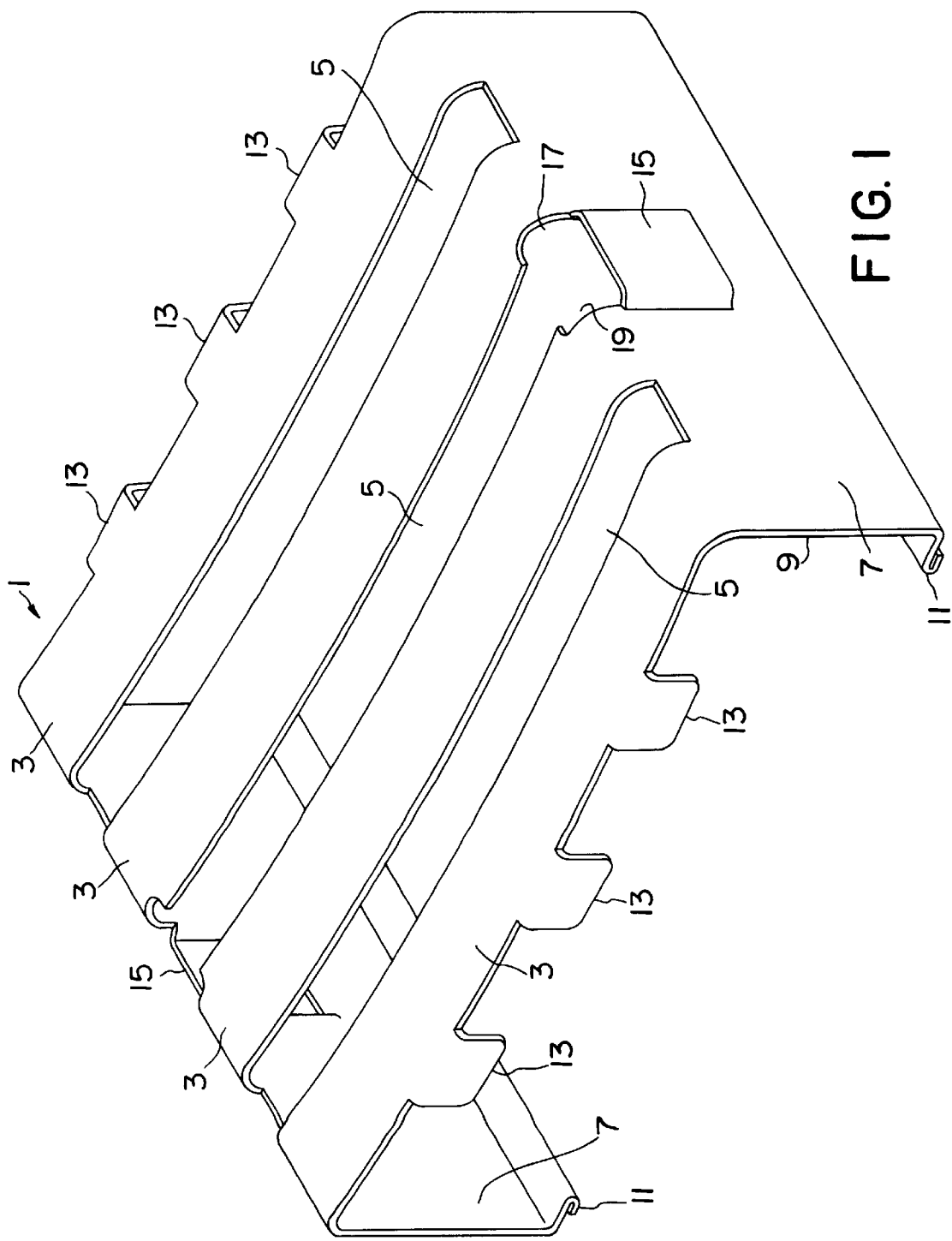
FIG. 1 represents a perspective view of an embodiment of an attachment structure according to the present invention for removably attaching a heat sink to an electronic package.

Typically, heat sinks are attached to electronic packages with adhesive and/or with one or more clips. However, both of these methods for attaching a heat sink have associated disadvantages. For example, a shortcoming of utilizing adhesives is that adhesives typically do not removably attach heat sinks to electronic packages. Adhesives can also require complicated tooling and special training for operators attaching the heat sinks to electronic packages. Also, adhesives typically require special handling. Often times, the special handling required for adhesives is not available at circuit card assembly plants.

Known clips for attaching heat sinks to electronic packages also have associated disadvantages. Along these lines, typical devices for clipping heat sinks to electronic packages utilize holes in a circuit card and/or around an electronic package. One drawback of such structures is that holes in circuit cards are not desirable since they take up space that could be used for circuit lines and/or other components. Also, a process must be carried out for forming the holes. This takes time and money.

If the heat sinks are bolted to the electronic package, they may also require additional parts to bolt or screw the heat sinks on. This also requires additional process steps. Some heat sinks may engage a socket of a socketed electronic package. Such sockets have shortcomings similar to holes that may be utilized to attach heat sinks to an electronic package. Other heat sinks may require special inserts placed between a heat sink and the electronic package. Furthermore, some heat sinks may require slots in the electronic package to attach the heat sink.

The present invention provides a structure that overcomes the above-described problems as well as others by providing a simple structure for clipping heat sinks to electronic packages. The structure of the present invention can removably attach heat sinks to electronic packages. The structure of the present invention makes possible replacement of a heat sink for any reason, whether a heat sink is damaged or a more efficient heat sink is required or for any other reason. Another advantage of the present invention is that it requires few parts. Additionally, the present invention may be utilized to removably attach heat sinks to a variety of surface mount packages. Furthermore, the present invention may be attached or removed with simple tooling and techniques.

A structure according to the present invention typically includes at least one heat sink engaging member for engaging the surface of a heat sink opposite a surface of the heat sink to be engaged by an electronic package. A heat sink engaging member may extend over the surface of the heat sink to any desirable degree. Along these lines, the heat sink engaging member could include one continuous member. The one continuous member could be at least as big as the entire surface of the heat sink opposite the surface of the heat sink to be engaged by the electronic package.

Alternatively, the at least one heat sink engaging member could have a cross-sectional area less than the surface area of the surface of the heat sink opposite the surface of the heat sink to be engaged by the electronic package. Along these lines, the heat sink could include one member that engages only one portion of a surface of the heat sink. For example, the at least one heat sink engaging member could engage a central portion of a heat sink.

The at least one heat sink engaging member may include at least one aperture formed therethrough. The aperture could permit heat to dissipate from the heat sink as well as receive one or more portions of a heat sink that could extend through the at least one aperture. The at least one heat sink engaging member could include at least one aperture regardless of its size absolutely and relative to the heat sink.

FIG. 1 represents a perspective view of an embodiment of a structure for removably attaching a heat sink to an electronic package according to the present invention. FIG. 1 illustrates a heat sink attachment structure 1 that includes a heat sink engaging member 3. The embodiment illustrated in FIG. 1 includes a plurality of spaced apart apertures 5 extending the length of the heat sink engaging member 3.

Rather than considering the embodiment of the present invention illustrated in FIG. 1 to include a single heat sink engaging member, each portion of the heat sink engaging member 3 could be considered to be individual heat sink engaging member separated by the apertures 5. Along these lines, the present invention can include any number of heat sink engaging members as well as any number of apertures arranged between the heat sink engaging members. A structure such as that illustrated in FIG. 1 could also include heat sink engaging members extending between the heat sink engaging members 3 illustrated in FIG. 1. Such an embodiment would include a crisscross pattern of heat sink engaging members with apertures formed therethrough.

It may be desirable to have the heat sink engaging member(s) have a small cross-sectional area as possible to help to maximize heat dissipated from a heat sink and an electronic package. Smaller heat sink engaging member(s) can also minimize the amount of material required to make the structure. However, strength of the heat sink engaging member(s) may also be taken into account.

A structure according to the present invention also includes at least two heat sink retaining clips. The embodiment illustrated in FIG. 1 includes two heat sink retaining clips 7. The heat sink retaining clips extend from opposite sides of the at least one heat sink engaging member. Each retaining clip typically includes a first arm for extending past at least a portion of a side of the heat sink and at least a portion of a side an electronic package.

The embodiment of structure illustrated in FIG. 1 includes two heat sink retaining clips 7. Each heat sink retaining clip 7 in the embodiment illustrated in FIG. 1 will extend along substantially the entire length of the heat sink. The heat sink retaining clips extend from the heat sink engaging member 3.

Since the embodiment of the heat sink engaging member in the embodiment illustrated in FIG. 1 includes apertures 5 that extend along the entire length of the heat sink engaging member, as stated above, the embodiment of the structure illustrated in FIG. 1 may be considered to include four heat sink engaging members. Along these lines, the retaining clips 7 in the embodiment illustrated in FIG. 1 may be thought of as joining together the heat sink engaging members 3. Alternatively, it can be considered that the retaining clips extend along the entire length of the heat sink engaging member 3.

The retaining clips and heat sink engaging member(s) may meet in a sharp angle. Alternatively, as in the embodiment illustrated in FIG. 1, the retaining clip(s) and heat sink engaging member(s) may meet in a rounded curve. The angle formed by the retaining clip(s) and the heat sink engaging member(s) may vary, depending upon the embodiment. As described below, the heat sink engaging member(s) may be curved. In such a case, the heat sink engaging member(s) and retaining clip(s) may define an acute angle. According to other embodiments, the heat sink engaging member(s) and heat sink retaining clip(s) may form a right angle. The heat sink retaining clip(s) and heat sink engaging member(s) may form an angle greater than 90°.

Each retaining clip may include a first arm 9 and a second arm 11. While the first arm 9 may extend past a portion of a side of a heat sink and a portion of a side of a portion of an electronic package, the second arm may engage a portion of the electronic package to help retain the structure and heat sink on the electronic package.

FIG. 1 illustrates one example of a first arm and second arm of a heat sink retaining clip. While the first arm or arms of heat retaining clips typically extend down past at least a portion of the side of the heat sink and at least a portion of a side of the electronic package, the second arm or arms 11 typically extend out from the first arm toward a portion of the electronic package. The second arm or arms may have a variety of shapes and configurations.

FIG. 1 illustrates a second arm 11 that extends entirely along the length of the first arm 9 of the retaining clips 7. The embodiment of the second arm 11 of the retaining clips 7 illustrated in FIG. 1 may engage a slot in an electronic package or a surface of an element of the electronic package that the heat sink is to be removably attached to. In other embodiments, the second arm such as that illustrated in FIG. 1 may include a plurality of portions extending along first arms 9 and retaining clips 7. Such a plurality of second arms 11 may be spaced with any desired spacing along first arm 9. As can be seen in FIG. 1, second arms 11 may be substantially the same thickness as first arms 9.

According to other embodiments, second arms 11 may be a plurality of bumps or other forms that could engage detents or other indentations in an electronic package. They could also engage a surface of a structure that the heat sink is to be removably attached to. In fact, second arms 11 could have any desired shape or configuration that could help to retain the structure and heat sink on the electronic package.

A structure according to the present invention may also include at least two heat sink retaining tabs extending from the heat sink engaging member. Typically, in an embodiment that includes heat sink retaining tabs, at least one tab extends from opposite sides of the at least one heat sink engaging member. Typically, these tabs extend from sides of the heat sink engaging member that a retaining clip or clips do not extend from. While the heat sink retaining clips may help retain the heat sink in a structure on an electronic package, typically, the heat sink retaining tabs may simply help to prevent the heat sink and/or retaining structure according to the present invention from shifting positions once attached to an electronic package, whether relative to each other or relative to the electronic package. The heat sink retaining tab(s) can extend along a portion of a heat sink engaging member or along the entire length of the heat sink engaging member.

FIG. 1 illustrates an embodiment of a heat sink retaining structure that includes an embodiment of heat sink retaining tabs 13 according to the present invention. The embodiment illustrated in FIG. 1 includes three tabs 13 extending from each side of the heat sink engaging member 3 that a heat sink retaining clip does not extend from. The heat sink retaining tabs 13 illustrated in FIG. 1 extend from the heat sink engaging member a distance at least far enough to engage at least a portion of the heat sink that the structure is designed to retain on an electronic package.

Typically, the at least one heat sink engaging tab also extends from the heat sink engaging member(s) a distance sufficient to engage at least a portion of a side surface of a structure on the electronic package that the heat sink is attached. In this manner, the heat sink retaining tab(s) may prevent the heat sink engaging member from shifting positions on the heat sink as well as helping to prevent the heat sink and retaining structure from shifting on the electronic package. A structure according to the present invention may include no heat sink retaining tabs, one heat sink retaining tab or a plurality of heat sink retaining tabs extending from the heat sink engaging member.

A heat sink attachment structure according to the present invention may also include at least one tool receiving member to engage a tool for helping to attach and remove the structure according to the present invention from an electronic package. Typically, a structure according to the present invention includes at least two tool receiving members arranged on opposite sides of the structure. More typically, each heat sink retaining clip includes at least one tool receiving member. However, the tool receiving member(s) may be provided on a portion of the structure of the present invention other than one or more of the retaining clips.

Typically, the at least one tool receiving member is arranged such that it can help to urge one or more of the retaining clips into and out of engagement with the heat sink and electronic package to facilitate attachment and removal of the structure and heat sink from the electronic package. Typically, this involves helping to bias the retaining clip or retaining clips such that the second arm of the heat sink retaining clip(s) disengages from the electronic package. Typically, a tool engaging slot is provided on each heat sink retaining clip.

FIG. 1 illustrates an embodiment of a tool receiving member 15 on each retaining clip 7 of the structure illustrated in FIG. 1. The embodiment of the tool receiving member 15 illustrated in FIG. 1 includes an outwardly flared portion of each retaining clip 7. Each tool receiving member may also be considered to include cut out portions 17 and 19 of the heat sink engaging member, heat sink retaining clip and border portion between the heat sink engaging member and heat sink retaining clip.

Each heat sink retaining clip could include more than one tool receiving member. For example, each heat sink retaining clip could include two tool receiving members. Typically, two such tool receiving members would be arranged equidistance from a center line of the heat sink retaining clip to help ensure that the heat sink retaining clip is equally biased along its length away from the heat sink and the electronic package to facilitate its removal.

Each tool receiving member could also take the form other than that illustrated in FIG. 1. For example, the tool receiving member could have a configuration similar to that illustrated in FIG. 1 but be a separate element attached to the retaining clip. Alternatively, the heat sink retaining member could have a different shape than that illustrated in FIG. 1. This may depend upon the shape of the tool utilized to attach and remove the heat sink and electronic package. The tool will be discussed in greater detail below.

In brief, a tool for engaging tool receiving member such as that illustrated in FIG. 1 may have a flat head portion. If the head portion were more like a needle nose plier, then the tool receiving member could have a different shape. In fact, the tool receiving member in such an embodiment could consist of a ring attached to the heat sink retaining clip.

A plurality of different materials could be utilized to form a heat sink attachment structure according to the present invention. For example, one or more metals and/or alloys could be used to form a heat sink. According to other embodiments, the heat sink could be made of one or more plastics. One example of such a material is a moldable polymer. The moldable polymer could be filled with thermally conductive filler, such as aluminum, silver, silica, alumina, and/or aluminum nitride.

The heat sink could be forged, cast, stamped, or otherwise formed into the desired shape. If necessary, certain portions may be cut out, such as to form the apertures 5 illustrated in FIG. 1.

A structure for removably attaching the heat sink to an electronic package according to the present invention may also include a heat spreader plate fixedly attached to the electronic package. According to such an embodiment, the attachment structure may removably attach the heat sink to the cover plate. According to some embodiments, the heat spreader plate may have a stepped configuration that includes one or more thinner portions in the vicinity of the edge of the heat spreader plate to help facilitate the attachment/removal of the structure for attaching the heat sink. The heat spreader plate will be discussed in greater detail below.

Figure 2:
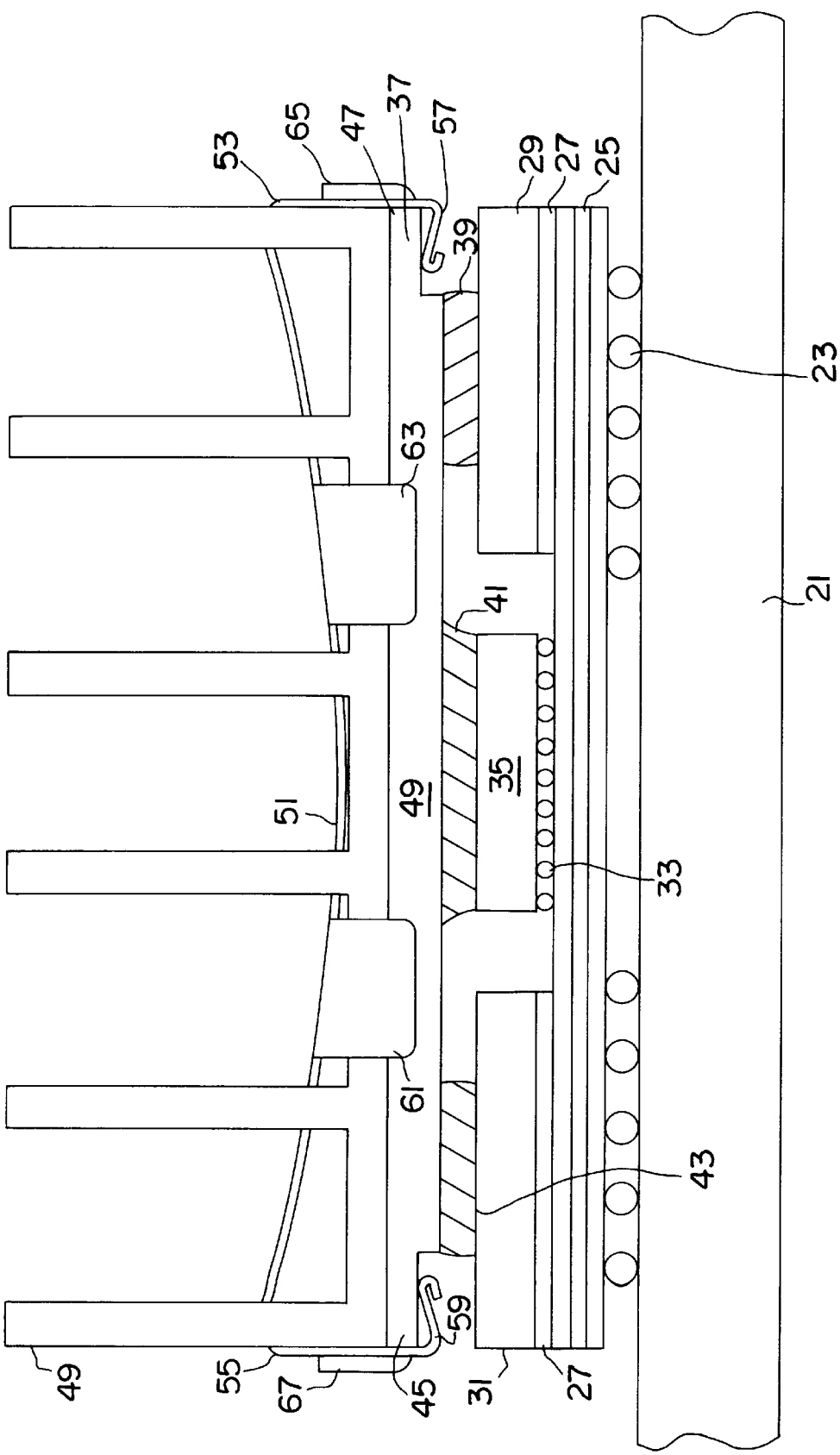
FIG. 2 represents a cross-sectional view of an embodiment of a surface mount package with a heat sink attached to an electronic package with a structure for removably attaching the heat sink to the package according to the present invention.

A cover plate such as that illustrated in FIG. 2 and others of the figures may be attached at the location where the electronic package is manufactured. This may facilitate attachment of the plate if adhesive is to be utilized since electronic package manufacturing plants are typically equipped to handle chemicals and proper tools and trained operators to carry out such processes. A package with a stepped plate may then be shipped to a circuit card assembly plant where it can be assembled to a card utilizing standard tooling processes. After card assembly, a heat sink can be clipped on the package.

FIG. 2 illustrates an embodiment of a structure according to the present invention, a heat sink, and a portion of an electronic package utilizing tape ball grid array (TBGA) package. FIG. 2 illustrates a circuit card 21 where solder balls 23 have been utilized to attach a chip support 25 to the circuit card. Adhesive layers 27 are utilized to attach stiffeners 29 and 31 to the chip support 25. Solder balls 33 are also utilized to attach a chip 35 to the chip support 25.

According to the present invention, a cover plate 37 may be attached utilizing adhesive 39, 41, and 43 to the stiffeners 29 and 31 and the semiconductor chip 35. Typically, the cover plate is made of a thermally conductive material. Examples of such materials include copper and aluminum. However, any thermally conductive material may be utilized here as long as it provides a desired degree of thermally conductivity. Those of ordinary skill in the art would be able to select materials to utilize in the cover plate to provide the desired degree of heat conductivity from the semiconductor chip.

Typically, with surface mount tape ball grid array packages such as that illustrated in FIG. 2, a flat cover plate is attached with adhesive to the stiffeners and the semiconductor chip. However, the cover plate 37 illustrated in FIG. 2 is a stepped cover plate as referred to above. The step of the stepped cover plate may be arranged in the vicinity of the periphery of the cover plate such that the cover plate includes regions 45 and 47 having a reduced thickness as compared to a central section 49. This may help to facilitate attachment removal of the heat sink and retaining structure from the cover plate by reducing the length of the retaining clips. Additionally, including a stepped cover plate can increase the distance between the cover plate and other portions of the electronic package, such as the stiffeners illustrated in FIG. 2 to provide a bigger space for retaining clip to fit into. This can reduce the likelihood of damage to the electronic package during attachment and removal of the heat sink.

It is not necessary that a stepped cover plate be utilized to attach a heat sink, in fact, a heat sink may be attached to any cover plate according to the present invention. The stepped cover plate may simply facilitate attachment removal of the heat sink. The stepped cover plate can also provide a structure for the heat sink to be attached to in electronic packages that do not include a cover plate.

FIG. 2 illustrates a heat sink 49 attached to an electronic package. The heat sink 49 illustrated in FIG. 2 is a typical pin fin heat sink. Of course, any heat sink providing the desired degree of heat conductivity as well as appropriate for the electronic package may be utilized.

In the embodiment illustrated in FIG. 2 or any other embodiment, material may be arranged between the heat sink and the electronic package. The material may facilitate transmission of heat from the electronic package to the heat sink, where the heat may then be dissipated. The material could include a grease or paste material. Alternatively, a material such as a compliant thermal pad could be provided between the heat sink and the electronic package. Any material may be utilized to help facilitate transmission of heat from the electronic package to the heat sink.

As can be seen in FIG. 2, the heat sink engaging member 51 of the structure according to the present invention can engage the top surface of a heat sink, opposite the surface of the heat sink attached to the cover plate or other portion of the electronic package. The heat sink engaging member 51 in the embodiment illustrated in FIG. 2 is curved. A curved heat sink engaging member may help to ensure that the heat sink engages the cover plate to help ensure that heat is transferred out of the semiconductor chip and electronic package. This happens by requiring the heat sink engaging member to be forced, against the curvature, toward the heat sink to be attached, thus creating a force on the heat sink.

The structure for removably attaching the heat sink illustrated in FIG. 2 includes heat sink retaining clips 53 and 55 extending from the heat sink and engaging member 51. The heat sink engaging clips 53 and 55 include second arms 57 and 59 that engage the underside of the stepped cover plate 37. As can be seen in FIG. 2, the second arms 57 and 59 of the retaining clips may be quite long, along these lines, the second arms 57 and 59 in the embodiment illustrated in FIG. 2 are much longer than the second arm 11 of the retaining clips illustrated in FIG. 1.

The attaching structure illustrated in FIG. 2 includes two heat sink retaining tabs 61 and 63. Typically, the retaining tabs are arranged spaced apart equidistantly from the center of the heat sink retaining member as illustrated in FIG. 2 and is also illustrated in the embodiment shown in FIG. 1. The embodiment illustrated in FIG. 2 also includes retaining tabs on the opposite side of the heat sink engaged member. However, these can not be seen in the view illustrated in FIG. 2.

The embodiment illustrated in FIG. 2 also includes tool retaining members 65 and 67. The embodiment of tool retaining members 65 and 67 shown in FIG. 2 is substantially as described above in the embodiment shown in FIG. 1.

Figure 3:
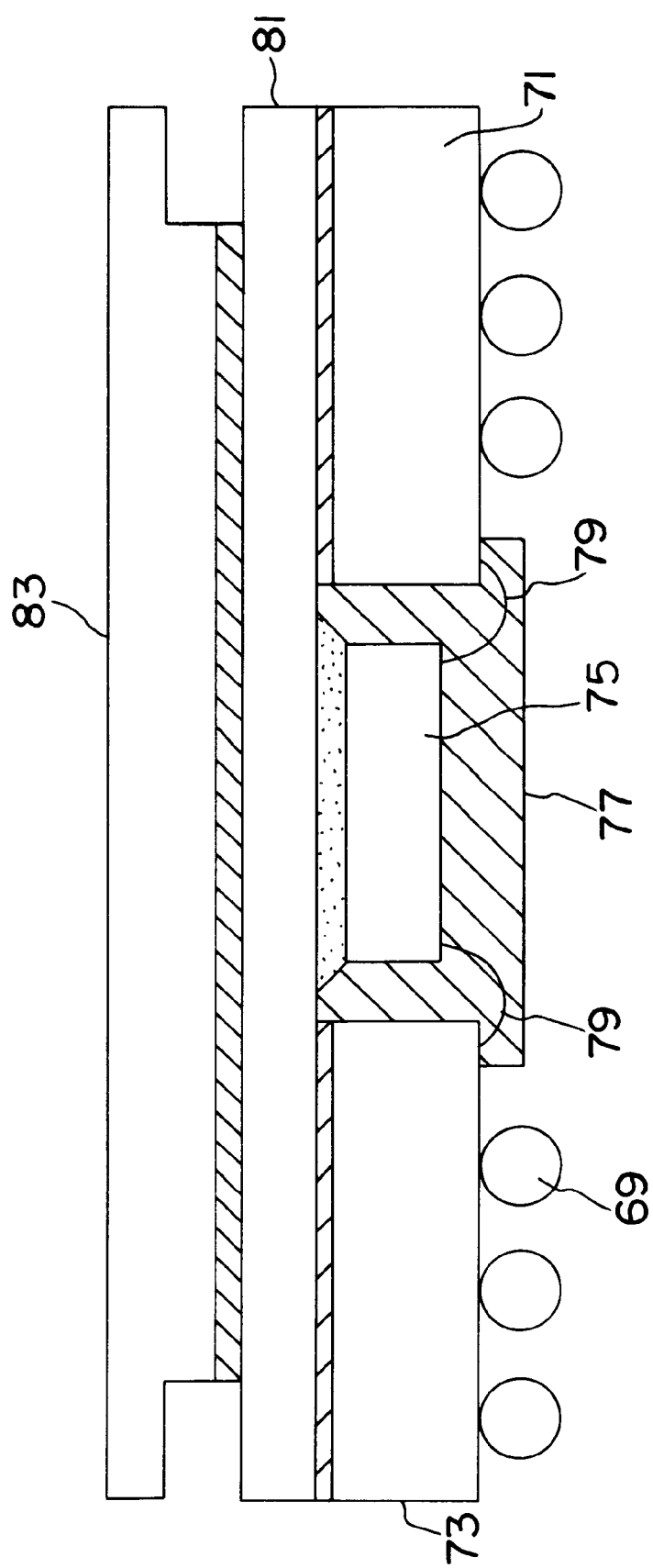
FIG. 3 represents a cross-sectional view of an embodiment of a portion of a surface mount electronic package according to the present invention prior to removably attaching a heat sink with a structure for removably attaching the heat sink according to the present invention.

FIG. 3 illustrates another embodiment of a portion of an electronic package that the present invention may be utilized with. The embodiment of the electronic package illustrated in FIG. 3 includes solder balls 69 attached to laminates 71 and 73. A semiconductor chip 75 within encapsulant 77 is interconnected by leads 79 to laminates 71 and 73. Laminates 71 and 73 and semiconductor chips 75 are attached to chip support 81. Laminates 71 and 73 may be attached to chip 75 to chip support 81 with one or more adhesives.

The surface mount package illustrated in FIG. 3 typically does not include a cover plate. Accordingly, a heat spreader plate 83 has been attached to structure 81. Typically, the heat spreader plate could be attached to the structure 81 with one or more adhesives.

Figure 4:
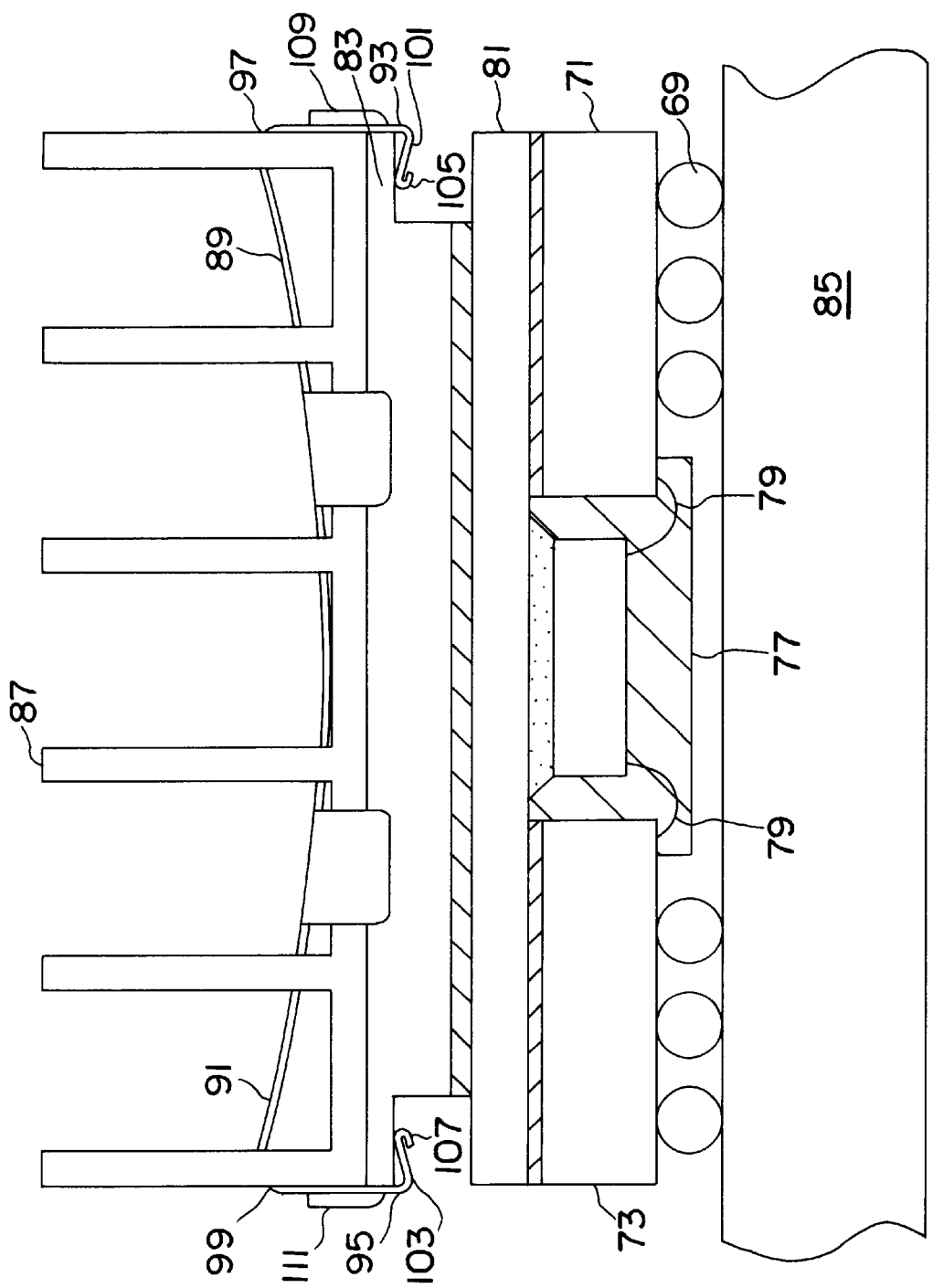
FIG. 4 represents a cross-sectional view of the structure illustrated in FIG. 3 with a heat sink removably attached to the electronic package with an embodiment of a structure for removably attaching the heat sink according to the present invention.

FIG. 4 illustrates the structure illustrated in FIG. 3 which has been attached to a circuit card 85 and to which a heat sink 87 has been attached with an attaching structure 89 according to the present invention. The attachment structure includes a heat sink engaging member 91, heat sink retaining clips 93 and 95. Each heat sink retaining clip includes a first arm 97 and 99 and second arm 101 and 103.

The retaining structure illustrated in FIG. 4 also includes tool retaining members 109 and 111.

As illustrated in FIG. 4 as well as in FIG. 2, the second arms of the heat sink retaining clips may include a rounded portion 105 and 107 on their ends. The rounded portions could be material, such as a metallic or polymeric material, attached to the second arms of the retaining clips. Alternatively, the material of the retaining clips could be simply rolled to form a rounded portion.

The rounded portion may help to reduce damage in the event that the second arm engaged a portion of the heat sink or electronic package when it is being removed or attached from the electronic package and simply while it engages a surface of the electronic package. For example, a non-rounded portion may scrape the heat sink, attachment plate, or other structure on the electronic package. If the scraped off material is electrically conductive material, it can cause shorts and/or electrical fails in the electronics.

The folded or rounded tip may help to prevent such damage and the resulting consequences.

Figure 5:
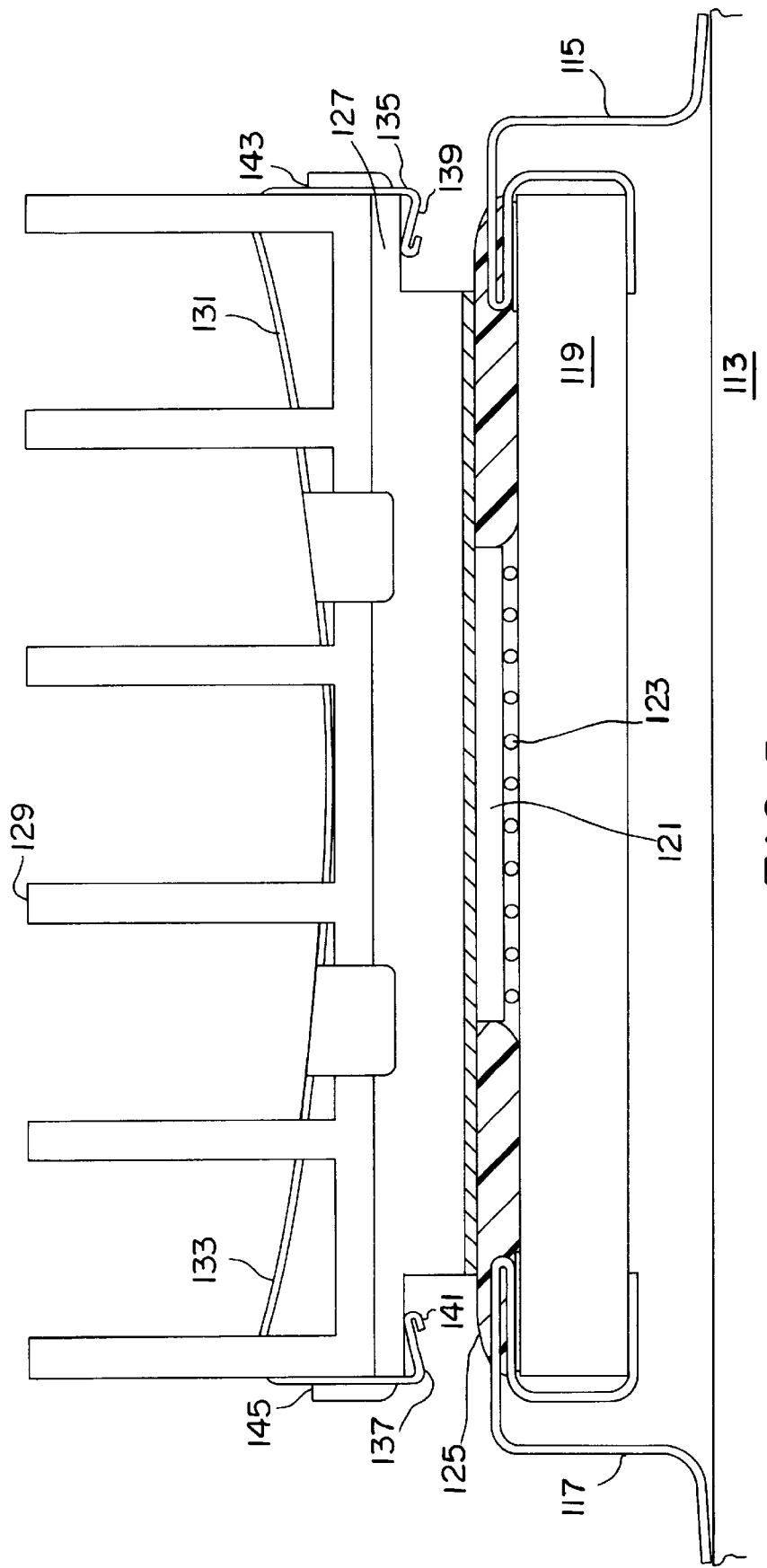
FIG. 5 represents a cross sectional view of an embodiment of a ceramic flat pack electronic package illustrating a heat sink removably attached to the electronic package utilizing an embodiment of a structure for removably attaching a heat sink according to the present invention.

FIG. 5 illustrates an embodiment of a structure for removably attaching a heat sink to an electronic package wherein the electronic package includes a surface mount ceramic flat pack. Accordingly, the structure illustrated in FIG. 5 includes a circuit card 113. Clips 115 and 117 extend from the upper surface of the circuit card 113 as illustrated in FIG. 5. The clips 115 and 117 engage a ceramic substrate 119. A C4 type chip 121 is attached to the ceramic substrate 119 with the C4 connections 123. The chip 121 and connections 123 are surrounded by an encapsulating material 125. A heat spreader plate 127 may be attached to chip 121 and may also be engaged by encapsulating material 125.

A heat sink 129 is removably attached to the heat spreader plate 127 with an attaching/retaining structure 131 according to the present invention. The attaching/retaining structure 131 includes a heat sink engaging member 133. Heat sink retaining clips 135 and 137 each include a second arm 139 and 141 engaging the underside of the plate 127. The structure also includes tool retaining members or engaging members 143 and 145.

Figure 6:
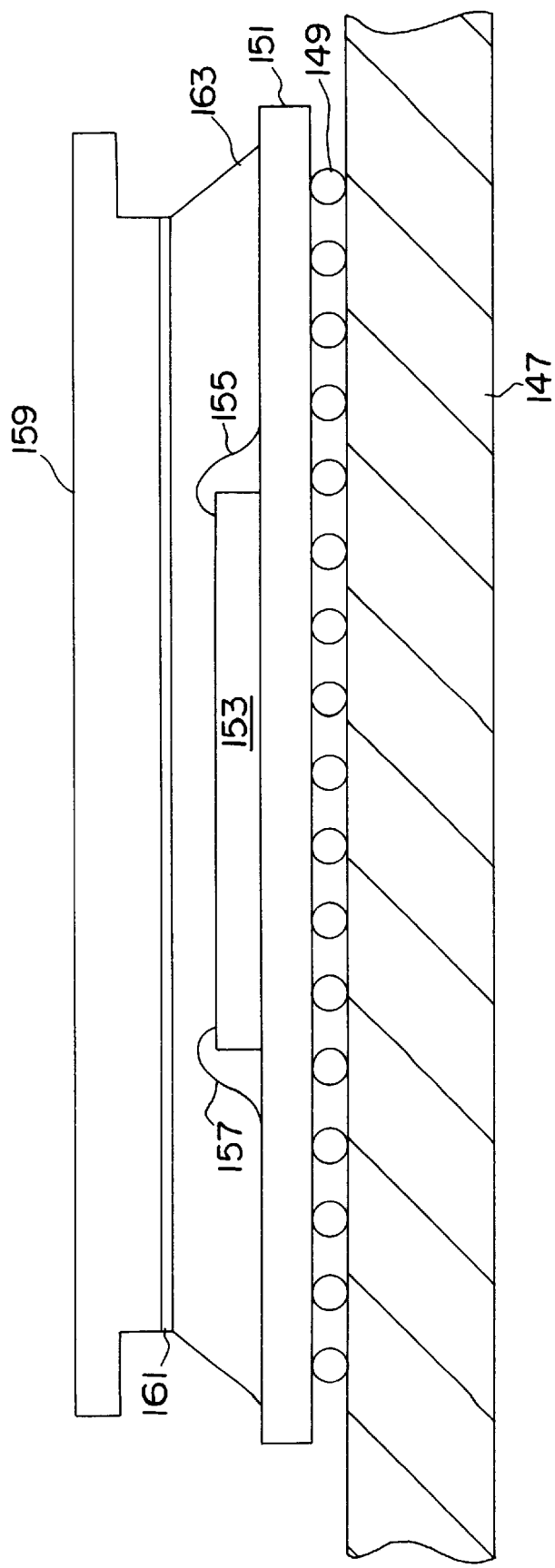
FIG. 6 represents a cross-sectional view of a portion of another embodiment of an electronic package prior to removably attaching a heat sink to the electronic package with the structure for removably attaching the heat sink to the electronic package according to the present invention.

FIG. 6 represents a cross-sectional view of yet another embodiment of an electronic package that a heat sink may be removably clipped to utilizing the structure according to the present invention. The structure illustrated in FIG. 6 includes a circuit card 147. Solder balls 149 are utilized to attach chip support 151 to the circuit card. A semiconductor chip 153 is mounted on the chip support. Leads 155 and 157 provide electronic connection between the chip and the chip support. A stepped cover plate 159 has been attached utilizing adhesive 161 to an encapsulant 163 surrounding the chip.

Figure 7:
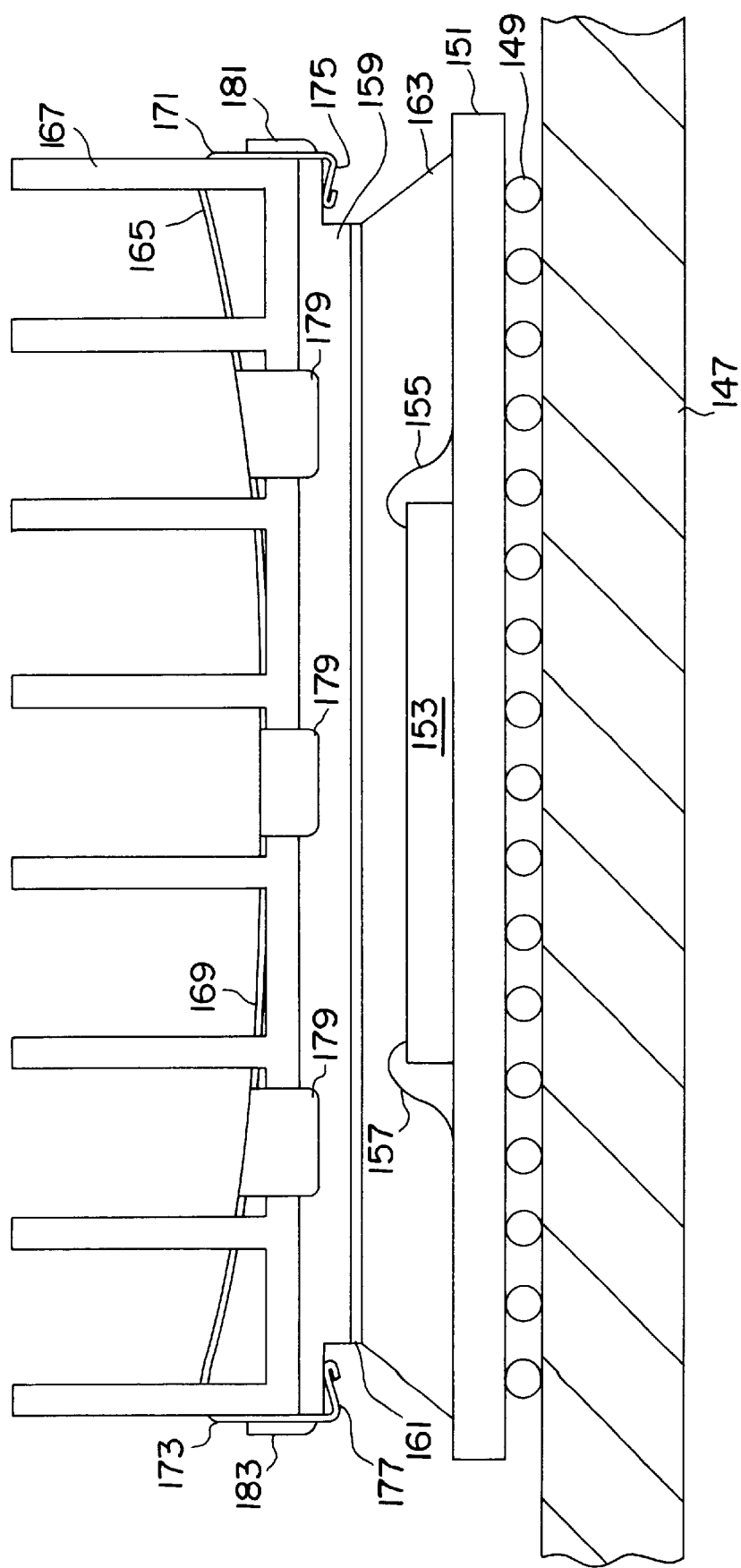
FIG. 7 represents a cross-sectional view of a portion of the electronic package illustrated in FIG. 6 with a heat sink removably attached to the electronic package with an embodiment of a structure for removably attaching a heat sink to an electronic package according to the present invention.

FIG. 7 illustrates the structure shown in FIG. 6 including a removably attached heat sink 167. The heat sink 167 is attached with an embodiment of a retaining structure 165 to the stepped cover plate 159. The retaining structure includes curved heat sink engaging member 169 and heat sink retaining clips 171 and 173. Each heat sink retaining clip includes a second arm 175 and 177 for engaging the underside of the stepped cover plate 159.

The embodiment illustrated in FIG. 7 includes three heat sink retaining tabs 179 to help prevent shift of the heat sink and retaining clip relative to the cover plate 159. Tool retaining members 181 and 183 are provided on the retaining clips 171 and 173.

Figure 8:
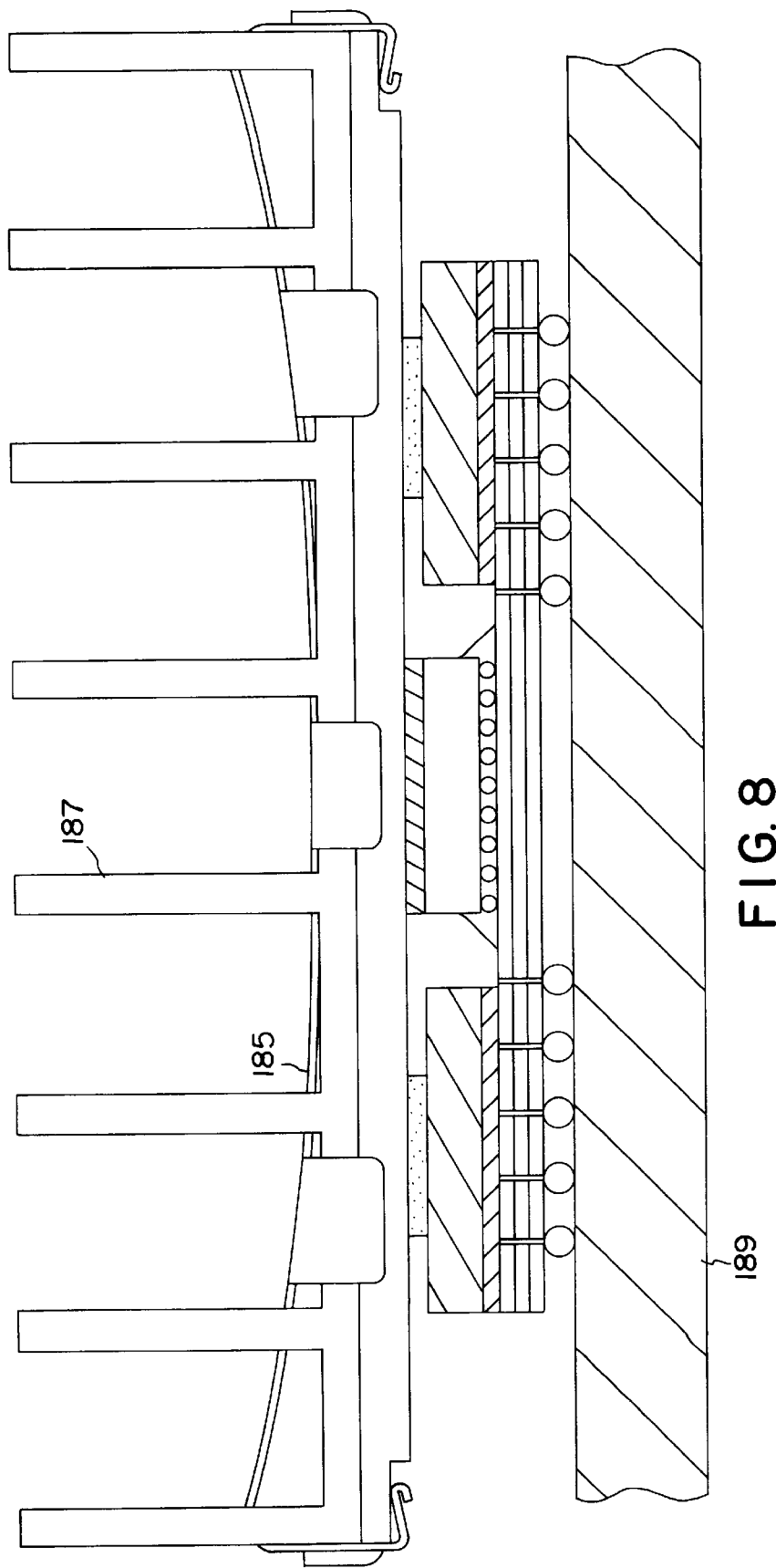
FIG. 8 represents a cross-sectional view of a portion of another embodiment of an electronic package with a heat sink removably attached utilizing an embodiment of a structure for removably attaching a heat sink according to the present invention.

FIG. 8 illustrates yet another application of a retaining structure 185 according to the present invention for removably attaching a heat sink 187 to an electronic package on circuit card 189.

Figure 9:
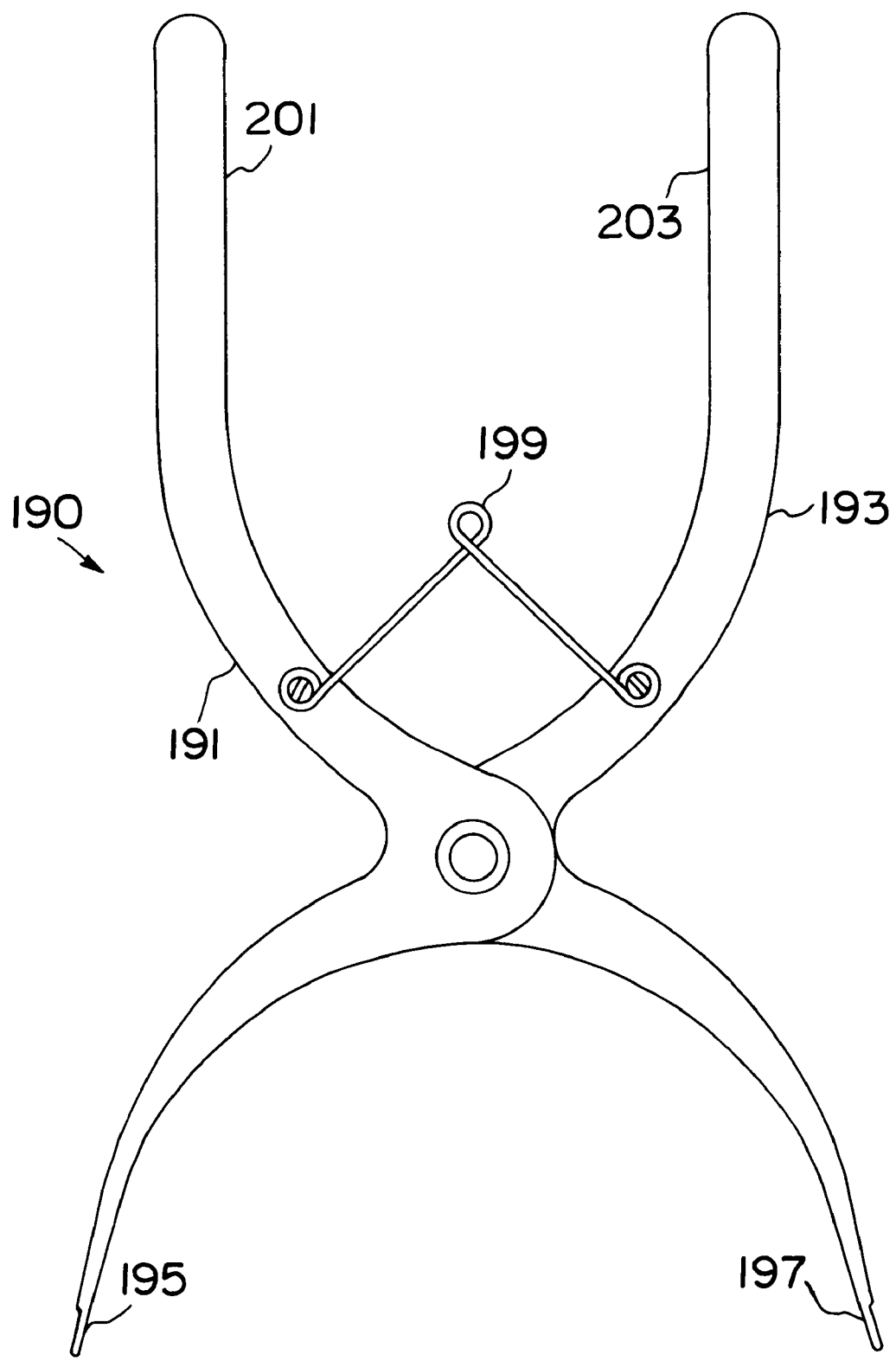
FIG. 9 represents a cross-sectional view of an embodiment of a tool for installing and removing a structure for removably attaching a heat sink to an electronic package according to the present invention.

FIG. 9 illustrates an embodiment of a tool for installation and removal of a structure for removably attaching a heat sink according to the present invention.

The embodiment of the tool illustrated in FIG. 9 includes a pair of arms 191 and 193. Each arm 191 and 193 includes, respectively, a nose 195 and 197 for engaging the tool engaging slots in the structure, such as that discussed above and illustrated in the other figures. A spring 199 biases the heads 195 and 197 of the arms 191 and 193, respectively, toward each other.

As referred to above, the tool may have different forms than the embodiment illustrated in FIG. 9. Along these lines, the heads could have a different shape, such as a needle nose, for example. Each arm could also include more than one head. However, the basic operation remains the same. One of ordinary skill in the art could determine alternative embodiments of a tool for attaching and removing a heat sink with a structure according to the present invention without undue experimentation once aware of the disclosure contained herein.

To engage a heat sink for removal or attachment, handle portions 201 and 203 of arms 191 and 193, respectively, are biased toward each other against the force of the spring. As the handles 201 and 203 move toward each other, the nose portions 195 and 197 move away from each other.

The nose portions 195 and 197 are moved apart at a sufficient distance to permit them to engage the tool receiving portions of the attachment structure. The tool may then engage the attachment structure. Then, the handle portions 201 and 203 are further biased toward each other against spring 199 to bias the retaining clips away from each other.

If the heat sink is being attached to an electronic package, the attachment structure is then arranged over the heat sink and a portion of the electronic package. The handle portions 201 and 203 may be released, upon appropriately positioning the attachment structure. Along these lines, the attachment structure typically is correctly positioned when the retaining clips are correctly positioned with respect to the heat sink and the electronic package. Once the retaining clips engage the side of the heat sink and retaining package, the tool may be removed.

If the heat sink and attachment structure are being removed from an electronic package, after biasing the retaining clips away from each other, the retaining structure may be moved away from the heat sink and electronic package until it has cleared the heat sink and the electronic package. The handle portions may then be released and the retaining structure removed from the tool, if desired.

Before or after attachment of the heat sink with the retaining structure, an electronic package may be assembled to a circuit card. Typically, the electronic package is attached to the card prior to attachment of the heat sink.

FIG. 10 illustrates the embodiment of the tool illustrated in FIG. 9 engaging an embodiment of a heat sink according to the present invention. FIG. 10 illustrates the heat sink attaching structure 205 with the retaining clips 207 and 209 biased apart. The heat sink 211 has been arranged on a cover plate 213. The attaching structure 205 is being lowered into position to removably attach the heat sink to the cover plate 213 and the electronic package. The electronic package illustrated in FIG. 10 is a tape ball grid array (TBGA) package.

FIG. 11 illustrates an example of a tip 215 of a second arm 217 of a retaining clip 219. As discussed above, the end portion of the second arm 217 may be formed by bending over the end of the second arm.

The present invention also includes an electronic package. An electronic package according to the present invention includes at least a semiconductor chip, a heat spreader plate that the chip is attached to, a heat sink, and an attachment structure for removably attaching the heat sink such as that described above.

The present invention also includes a method for removably attaching the heat sink to an electronic package. The method includes providing an attachment structure such as that described above. The retaining clips are biased apart. The attachment structure is arranged over the heat sink and the electronic package, the retaining clips are released, and the electronic package is engaged with the second arm of the attachment structure.

Arranging the attachment structure over the heat sink may include biasing the retaining clips away from each other, arranging the attachment structure over the heat sink, and a portion of the electronic package and releasing the retaining clips. Biasing the retaining clips may include engaging the retaining clips with at least one tool and causing the tool to bias the retaining clips away from each other. Engaging the attachment structure with the tool may include engaging at least one tool receiving member with an installation and removal tool. Releasing the retaining clips may include causing the tool to release the retaining clips.

A method according to the present invention may also include removing or detaching the attachment structure from the heat sink in the electronic package. Removing the heat sink typically includes biasing the retaining clips away from each other. The retaining structure is then moved out of engagement with the heat sink and electronic package.

Rather than utilizing a tool, the attachment structure may be manually caused to engage and disengage the heat sink and electronic package.

Figure 12:
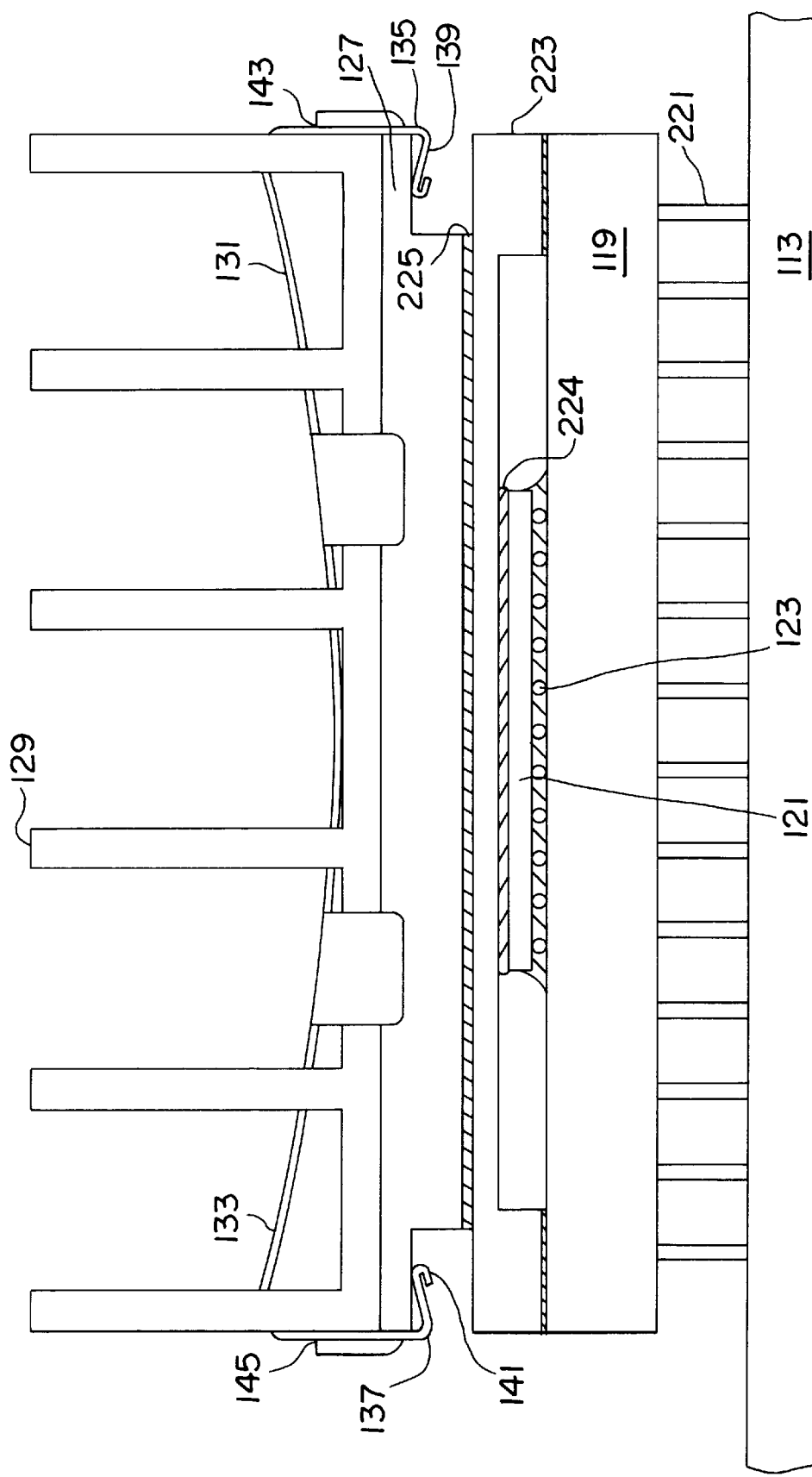
FIG. 12 represents a cross-sectional view of a portion of another embodiment of an electronic package with a heat sink removably attached to the electronic package with the structure for removably attaching the heat sink to the electronic package according to the present invention, wherein the electronic package includes a ceramic column grid array.

FIG. 12 illustrates a cross-sectional view of yet another embodiment of an electronic package that includes a heat sink attach device according to the present invention.

The electronic package illustrated in FIG. 12 includes a ceramic column grid array (CCGA) with the removably attached heat sink. The package includes a ceramic substrate with a C4 type chip 121. An underfill, such as an epoxy material, provides support to the chip between the chip and the substrate. A ceramic or metallic cap 223 protects the chip from mechanical damage. A layer of thermally conductive grease or paste 224 is provided between the chip 121 and the cap 223 to help provide a thermally conductive path to the cap for cooling the chip.

FIG. 12 illustrates the heat sink attach plate 127 bonded to the cap 223 with an adhesive 225. The heat sink 129 is clipped to the plate 127. A layer of thermally conductive grease or paste is provided between the heat sink and the electronic package as described above to help provide a thermally conductive path to the heat sink.

The assembly is attached to a circuit card 113 utilizing solder columns 221. The structure illustrated in FIG. 12 represents a variation of a ceramic ball grid array package. According to another version of such a package including the removably attached heat sink, the plate 127 and the cap 223 are integrated into one piece. This may help to eliminate the adhesive interface and improve cooling.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A structure for removably attaching a heat sink to a packaged electronic part, comprising:

a thermally conductive plate having opposing first and second surfaces, the second surface being mounted on a surface of the packaged electronic part and having at least two free edges extending beyond the surface of the packaged electronic part;

at least one heat sink engaging member engaging a first surface of the heat sink opposite a second surface of the heat sink engaging the first surface of the thermally conductive plate; and at least two heat sink retaining clips extending from opposite sides of the at least sink engaging member, each retaining clip including a first arm extending past a side of the heat sink and a portion of the thermally conductive plate and a second arm extending from the first arm engaging the second surface of the thermally conductive plate on a separate edge.

2. The structure according to claim 1, wherein the heat sink engaging member includes at least one aperture formed therethrough.

3. The structure according to claim 1, wherein the heat sink engaging member includes a plurality of spaced apart apertures extending along the heat sink engaging member for receiving elements of the heat sink.

4. The structure according to claim 2, wherein the at least two heat sink retaining clips extend along substantially the entire length of two opposite sides of the heat sink engaging member.

5. The structure according to claim 1, further comprising:
at least two heat sink retaining tabs, at least one tab extending from each of at least two opposite sides of the at least one heat sink engaging member, each retaining tab extending past a side surface of the heat sink and a side surface of the thermally conductive plate other than the side surface of the heat sink and the side surface of the thermally conductive plate that the retaining clips extend past, to prevent the at least one heat sink from substantially shifting position in relation to the thermally conductive plate with the contact force exerted by one or more of the retaining tabs against the thermally conductive plate.

6. The structure according to claim 5, further comprising:
a plurality of heat sink retaining tabs extending from each of at least two opposite sides of the at least one heat sink engaging member.

7. The structure according to claim 1, further comprising:
at least two tool receiving members arranged on opposite sides of the structure for receiving a tool for attaching and removing the structure from the packaged electronic part.

8. The structure according to claim 7, wherein each tool receiving member is provided on a retaining clip.

9. The structure according to claim 7, wherein the tool receiving members each comprise an outwardly flared portion of each retaining clip.

10. An electronic package, comprising:
a packaged semiconductor chip;
a heat spreader plate that the packaged semiconductor chip is attached to;
a heat sink;
an attachment structure removably attaching the heat sink to the heat spreader plate, the attachment structure comprising at least one heat sink engaging member engaging a surface of the heat sink opposite a surface of the heat sink engaging the heat spreader plate, and at least two heat sink retaining clips extending from opposite sides of the at least one heat sink engaging member, each retaining clip including a first arm extending past a side of the heat sink and a side of the heat spreader plate and a second arm extending from the first arm engaging the heat spreader plate.

11. A method of removably attaching a heat sink to a packaged electronic part, the method comprising:
arranging the heat sink on a surface of the packaged electronic part;
providing an attachment structure removably attaching the heat sink to a heat spreader plate of the packaged electronic part, the attachment structure comprising at least one heat sink engaging member engaging a surface of the heat sink opposite a surface of the heat sink engaging the heat spreader plate, and at least two heat sink retaining clips extending from opposite sides of the at least one heat sink engaging member, each retaining clip including a first arm extending past a side of the heat sink and a side of the heat spreader plate and a second arm extending from the first arm engaging the heat spreader plate.

12. The method according to claim 11, wherein arranging the attachment structure over the heat sink comprises:
biasing the retaining clips away from each other;
arranging the attachment structure over the heat sink and a portion of the packaged electronic part; and
releasing the retaining clips.

13. The method according to claim 12, wherein biasing the retaining clips away from each other comprises:
engaging at least tool receiving members on the attachment structure with an installation and removal tool; and
causing the tool to bias the retaining clips away from each other.

14. The method according to claim 12, wherein releasing the retaining clips comprises:
causing the tool to release the retaining clips.

15. A method of attaching and removing a heat sink to a packaged electronic part, the method comprising:
arranging the heat sink on a surface of the packaged electronic part;
providing an attachment structure removably attaching the heat sink to a heat spreader plate of the packaged electronic part, the attachment structure comprising at least one heat sink engaging member engaging a surface of the heat sink opposite a surface of the heat sink engaging the heat spreader plate, and at least two heat sink retaining clips extending from opposite sides of the at least one heat sink engaging member, each retaining clip including a first arm extending past a side of the heat sink and a side of the heat spreader plate and a second arm extending from the first arm engaging the heat spreader plate.
detaching the attachment structure from the heat sink and the packaged electronic part.

* * * * *